(12) United States Patent
Shikata

(10) Patent No.: US 6,307,244 B1
(45) Date of Patent: Oct. 23, 2001

(54) SCHOTTKY BARRIER SEMICONDUCTOR DEVICE

(75) Inventor: Hideaki Shikata, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 09/368,897

(22) Filed: Aug. 6, 1999

(30) Foreign Application Priority Data

Aug. 12, 1998 (JP) .................................... 10-228454
Aug. 12, 1998 (JP) .................................... 10-228455
Aug. 12, 1998 (JP) .................................... 10-228456

(51) Int. Cl.$^7$ .................................................. H01L 27/095
(52) U.S. Cl. ........................... 257/471; 257/484; 438/570
(58) Field of Search ..................................... 257/471, 472, 257/473, 474, 481, 482, 483, 484; 438/92, 167, 534, 570, 580–582

(56) References Cited

U.S. PATENT DOCUMENTS 6,175,143 * 1/2001 Fujihira et al. ...................... 257/471
6,177,712 * 1/2001 Miyasaka ............................. 257/484

FOREIGN PATENT DOCUMENTS 59-35183  8/1984  (JP) .

* cited by examiner

Primary Examiner—David Nelms
Assistant Examiner—Dung Ang Le
(74) Attorney, Agent, or Firm—Arent Fox Kintner Plotkin & Kahn, PLLC

(57) ABSTRACT

A Schottky barrier semiconductor device comprises an $n^+$-type semiconductor substrate, an $n^-$-type semiconductor layer grown on the semiconductor substrate by epitaxial growth, and two or more adjacent $p^+$-type semiconductor regions formed on a surface of the semiconductor layer. The device comprises a metal layer having a Schottky barrier on the surface of an active region of the semiconductor layer. The $p^+$-type semiconductor regions are formed so that a ratio of a distance between the adjacent $p^+$-type semiconductor regions to a distance between the bottom surface of the $p^+$-type semiconductor region and the bottom surface of the semiconductor layer may be the ratio of 1 to 1 through 2. And/or a thickness of the $n^-$-type semiconductor layer that is the active region which does not have the adjacent $p^+$-type semiconductor regions may be less than the distance between the upper surface of the $p^+$-type semiconductor region and the upper surface of the semiconductor substrate. Consequently, the Schottky barrier semiconductor device is obtained which has a low forward voltage with a reverse leakage current reduced and can thus achieve a power saving and be driven at a low voltage.

12 Claims, 6 Drawing Sheets

SCHOTTKY BARRIER SEMICONDUCTOR DEVICE

FIELD OF THE INVENTION

The present invention relates to a Schottky barrier semiconductor device having a metal layer having a Schottky barrier on a semiconductor layer that is an active layer on a semiconductor substrate and a method of manufacturing the same. More particularly, this invention relates to a Schottky barrier semiconductor device having less leakage current and a low forward voltage and a method of manufacturing the same.

BACKGROUND OF THE INVENTION

A Schottky barrier diode (SBD) is widely used in a rectifier circuit for high frequency because the SBD has high-speed switching properties and less forward loss. A conventional SBD has a structure having a cross section shown in FIG. 9, for example. That is, reference numerals in FIG. 9 denote elements as described below. Numeral 1 denotes an $n^+$-type semiconductor substrate composed of silicon or the like, for example. Numeral 2 denotes a semiconductor layer which is grown by epitaxial growth on the semiconductor substrate 1 and is an $n^-$-type active layer, for example. Numeral 3 denotes a metal layer composed of molybdenum (Mo) or the like and forming having a Schottky barrier. Numeral 4 denotes a guard ring having a $p^+$-type dopant diffused into a surface of the semiconductor layer 2 near an outer periphery of the metal layer 3 and formed in order to increase a withstand voltage in the periphery of a Schottky junction. Numeral 5 denotes an insulating film which is formed on the surf ac e of the semiconductor layer 2 by thermal oxidation, CVD (chemical vapor deposition) or the like and composed of $SiO_2$ or the like, for instance.

The properties of a forward voltage $V_F$ and a reverse leakage current $I_R$ of the SBD obtained by the Schottky junction of the metal layer 3 and the semiconductor layer 2 are changed as shown in FIG. 10 in accordance with an inherent barrier value $\phi_b$ of a metallic material and the semiconductor layer. Ti, Mo or the like is practically used as the metallic material for obtaining this type of Schottky junction in view of ease of treatment, economy, reliability and so on The forward voltage and the reverse leakage current are determined in accordance with the barrier value of the material. There is a reciprocal relationship between the forward voltage and the reverse leakage current. Thus, the material having less leakage current has a high forward voltage, whereas the material having a low forward voltage has more reverse leakage current. Both of the leakage current and the forward voltage cannot be therefore reduced.

On the other hand, the structure shown in FIG. 11 for increasing a reverse withstand voltage by reducing the reverse leakage current of a Schottky barrier semiconductor device is disclosed in Japanese Patent Publication No. 59-35183. That is, numerals 1 to 5 in FIG. 11 denote the same elements as the elements having numerals 1 to 5 in FIG. 9. Numeral 6 denotes stripe-like or spot-like $p^+$-type semiconductor regions formed on the surface of the $n^-$-type semiconductor layer 2 that is the active layer. The semiconductor region 6 has the structure for increasing the withstand voltage by reducing the reverse leakage current by a depletion layer formed on the side of the semiconductor layer 2. In this structure, the $p^+$-type semiconductor region is not an active region and thus the area of the active region is reduced.

As described above, the properties of the Schottky barrier using the practical metallic material for forming the conventional Schottky barrier have the properties of the forward voltage and the leakage current depending on the material. Thus, the reciprocal properties cannot be avoided. In order to reduce the reverse leakage current, the semiconductor region of a different conductive type from the conductive type of the semiconductor layer (e.g., a p-type region with respect to an n-type semiconductor layer) is formed on the surface of the above-described semiconductor layer that is the active layer. In this case, the p-type region is not the active region and thus the area of the active region of the semiconductor layer is reduced. When the area is reduced, a problem is caused. That is, a serial resistance between the metal layer and electrodes provided on a rear surface of the semiconductor substrate is increased, and consequently the forward voltage is increased. The Schottky barrier semiconductor device is characterized by the low forward voltage. For the recent lightening, thinning and reduction, power saving and low-voltage driving of electronic equipments, the high-performance Schottky barrier semiconductor device is required in which both of the forward voltage and the reverse leakage current are further reduced without increasing a chip area.

Heretofore, one problem has been that the reverse withstand voltage is increased as disclosed in Japanese Patent Publication No. 59-35183, for example. In order to increase the reverse withstand voltage, it is necessary to increase the distance between the lower end of a p-type diffusion region and the lower end of the semiconductor layer 2. This distance is about 3 to 4 times the distance between the p-type diffusion regions 6. Thus, another problem occurs. That is, the forward serial resistance is further increased and thus the forward voltage is increased. On the other hand, in many cases, the Schottky barrier semiconductor device has been recently used together with IC or the like at a low voltage of a secondary power source. Thus, the reverse withstand voltage has only to satisfy tens of volts, e.g., about 30 V, whereas the Schottky barrier semiconductor device having the much lower forward voltage and the still less leakage current is required for the power saving and low-voltage driving of the electronic equipment as described above.

SUMMARY OF THE INVENTION

The present invention is made in order to solve the above problems. It is an object of the invention to provide a Schottky barrier semiconductor device which has a low forward voltage with a reverse leakage current reduced and can thus achieve a power saving and be driven at a low voltage, and a method of manufacturing the same.

A Schottky barrier semiconductor device according to a first aspect of the present invention comprises a heavily-doped and first conductive type semiconductor substrate; a lightly-doped and first conductive type semiconductor layer grown by epitaxial growth on the semiconductor substrate; two or more adjacent second conductive type semiconductor regions formed on a surface of the semiconductor layer; and a metal layer having a Schottky barrier formed on the surface of the semiconductor layer and the second conductive type semiconductor regions, wherein the second conductive type semiconductor regions are formed so that a ratio of a distance between the adjacent second conductive type semiconductor regions to a distance between a bottom surface of the second conductive type semiconductor region and a bottom surface of the first conductive type semiconductor layer may be the ratio of 1 to 1 through 2.

In this structure, the distance between the second conductive type semiconductor regions is such that depletion layers are in contact with each other. Thus, the semiconductor layer is substantially covered with the depletion layer and therefore a leakage current is interrupted. Consequently, the semiconductor layer has an additional thickness of about 1 µm to 3 µm under the depletion layer formed by a pn junction under the second conductive type semiconductor region. A withstand voltage of tens of volts, e.g., about 30 V can be ensured. On the other hand, the thickness of an epitaxial layer is a minimum thickness which can secure the withstand voltage of tens of volts. Thus, a serial resistance of a Schottky diode is very low, and therefore the device having a low forward voltage can be obtained without increasing the forward voltage.

The distance between the adjacent second conductive type semiconductor regions is such that the depletion layers formed in the first conductive type semiconductor layer by the adjacent second conductive type semiconductor regions for a desired reverse withstand voltage are in contact with each other. Thus, the leakage current can be efficiently interrupted.

Preferably, the surface of the semiconductor layer is etched so that the thickness of the first conductive type and lightly-doped semiconductor layer that is an active region which does not have the second conductive type semiconductor regions may be less than the distance between an upper surface of the second conductive type semiconductor region and an upper surface of the semiconductor substrate. Alternatively, preferably, first conductive type and heavily-doped buried regions are formed in the semiconductor layer on the side of the semiconductor substrate. These structures are preferable because the structures reduce the distance of the first conductive type semiconductor layer between both electrodes of the Schottky barrier semiconductor device, thus reduce the serial resistance and therefore contribute to reducing the forward voltage.

Preferably, the second conductive type semiconductor regions are formed into a matrix form because the depletion layer can be effectively formed in the semiconductor layer that is the active region and thus the leakage current can be reduced.

A Schottky barrier semiconductor device according to a second aspect of the present invention comprises a heavily-doped and first conductive type semiconductor substrate; a lightly-doped and first conductive type semiconductor layer grown by epitaxial growth on the semiconductor substrate; two or more adjacent second conductive type semiconductor regions formed on a surface of the semiconductor layer; and a metal layer having a Schottky barrier formed on the surface of the semiconductor layer and the second conductive type semiconductor regions, wherein a thickness of the lightly-doped and first conductive type semiconductor layer that is an active region which does not have the second conductive type semiconductor regions is less than a distance between an upper surface of the second conductive type semiconductor region and an upper surface of the semiconductor substrate.

In this structure, the second conductive type semiconductor regions are formed on the first conductive type semiconductor layer that is an active layer. Thus, the reverse leakage current is prevented by the depletion layer and therefore the leakage current can be reduced. On the other hand, the thickness of the lightly-doped semiconductor layer that is the active region is reduced. Thus, the serial resistance is reduced and, as a result, the forward voltage can be reduced.

A part of the surface of the first conductive type semiconductor layer that is the active region which does not have the second conductive type semiconductor regions is removed. In this structure, the surface is selectively oxidized and etched or directly selectively etched, whereby the first conductive type semiconductor layer can be simply and controllably thinned.

First conductive type and heavily-doped buried regions are formed on the side of the semiconductor substrate in the first conductive type semiconductor layer that is the active region which does not have the second conductive type semiconductor regions. In this structure, the heavily-doped buried regions are formed on a lower surface of the lightly-doped semiconductor layer that is the active region. Thus, the thickness of the lightly-doped semiconductor layer is reduced. Therefore, the serial resistance is reduced and thus the forward voltage can be reduced.

A method of manufacturing a Schottky barrier semiconductor device of the present invention comprises the steps of; (a) growing by epitaxial growth a lightly-doped and first conductive type semiconductor layer on a heavily-doped and first conductive type semiconductor substrate; (b) forming a mask on a surface of an active region of the semiconductor layer grown by the epitaxial growth and then introducing a second conductive type impurity into the semiconductor layer, thereby forming two or more adjacent second conductive type semiconductor regions; (c) forming an oxidation-resistant mask on a surface of the semiconductor layer and the semiconductor regions, the oxidation-resistant mask coating the surface of the second conductive type semiconductor regions therewith and exposing the first conductive type semiconductor layer, and then oxidizing the semiconductor layer, thereby oxidizing the exposed surface of the first conductive type semiconductor layer; (d) removing the oxidation-resistant mask and an oxide film formed by the oxidation; and (e) forming a metal layer having a Schottky barrier on the first conductive type semiconductor layer and the second conductive type semiconductor regions exposed by removing the oxide film.

Another manufacturing method of the present invention comprises the steps of; (f) selectively introducing a first conductive type impurity into the surface of a heavily-doped and first conductive type semiconductor substrate; (g) growing by epitaxial growth a lightly-doped and first conductive type semiconductor layer on the surface of the semiconductor substrate, and forming heavily-doped buried regions by a rise of the introduced first conductive type impurity; (h) forming a mask on the surface of the semiconductor layer grown by the epitaxial growth, so as to cover a portion corresponding to an area in which the first conductive type impurity is introduced into the semiconductor substrate, and then introducing a second conductive type impurity into the semiconductor layer, thereby forming two or more adjacent second conductive type semiconductor regions on the surface of the semiconductor layer in the area between the areas in which the buried regions are formed; and (i) forming a metal layer having a Schottky barrier on the surface of the semiconductor layer and the second conductive type semiconductor regions.

DETAILED DESCRIPTION

Figure 1:
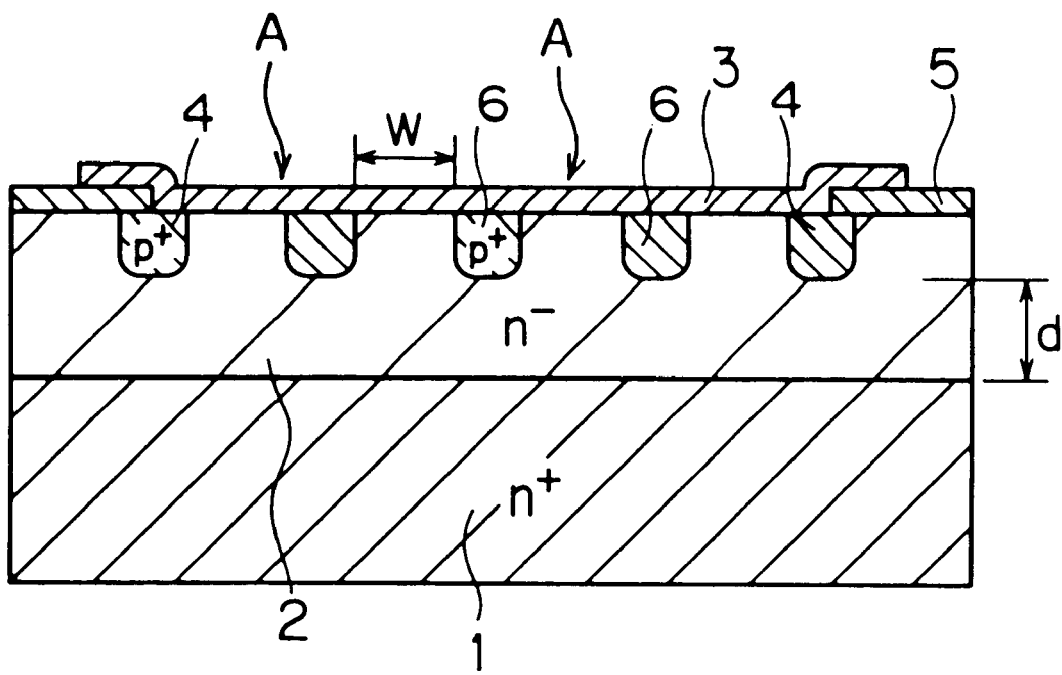
FIGS. 1(a) and 1(b) illustrate one embodiment of a Schottky barrier semiconductor device of the present invention.
Figure 1:
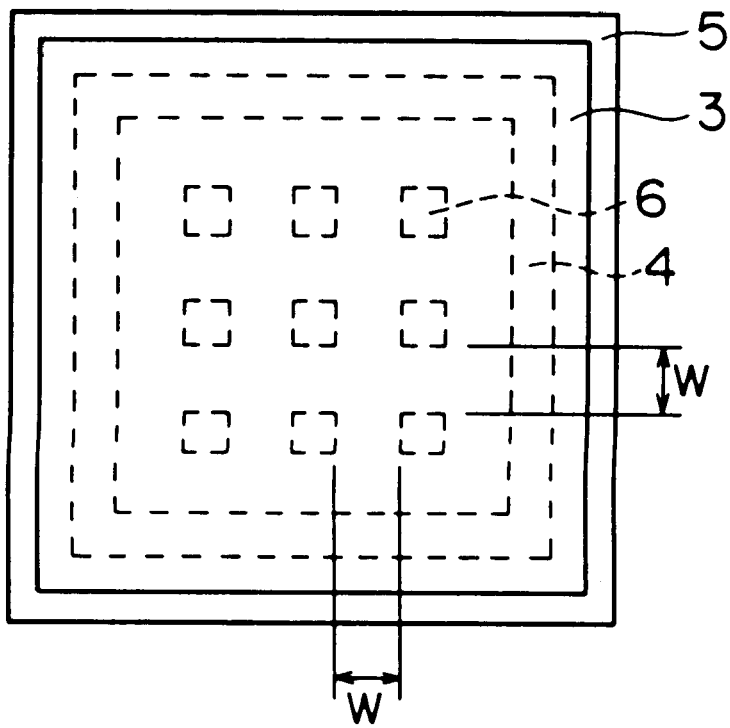

As shown in FIG. 1(a) illustrating a cross section of one embodiment, a Schottky barrier semiconductor device of the present invention comprises, heavily-doped and first conductive type for example, an $n^+$-type, semiconductor substrate 1; lightly-doped and first conductive type, for example an $n^-$-type, semiconductor layer 2 grown on the semiconductor substrate 1 by epitaxial growth; two or more adjacent and second conductive type, for example $p^+$-type, semiconductor regions 6 formed on a surface of the semiconductor layer 2; and a metal layer 3 having a Schottky barrier on the surface of an active region of the semiconductor layer 2. The Schottky barrier semiconductor device is characterized by that the second conductive type semiconductor regions 6 are formed so that a ratio of w to d may be the ratio of 1 to 1 through 2, where w denotes a distance w between the adjacent second conductive type semiconductor regions 6 and d denotes a distance between a bottom surface of the second conductive type semiconductor region 6 and the bottom surface of the semiconductor layer 2 (the upper surface of the semiconductor substrate 1).

The semiconductor substrate 1 is composed of $n^+$-type silicon having an impurity density of about $1 \times 10^{19}$ cm$^{-3}$, for example. The semiconductor substrate 1 has a thickness of about 200 μm to 250 μm, for example. The semiconductor layer 2 formed on the semiconductor substrate 1 is an $n^-$-type silicon semiconductor layer having an impurity density of about $1 \times 10^{15}$ cm$^{-3}$, for example. The semiconductor layer 2 is grown by epitaxial growth to a thickness of about 4 μm to 6.5 μm, for example.

$P^+$-type regions that are guard rings 4 are formed to a depth of about 1.5 μm to 2 μm on the surface of an outer periphery of an area that is the active region of the semiconductor layer 2. At the same time when the guard rings 4 are formed, the $p^+$-type semiconductor regions 6 are formed into a matrix form on the surface of the semiconductor layer 2 that is the active region, as shown in a plan view of FIG. 1(b) (although nine semiconductor regions 6 are shown in the drawing, hundreds of semiconductor regions 6 are actually formed). The $p^+$-type semiconductor regions 6 may be formed into not the matrix form but a stripe shape. The semiconductor regions 6 are, however, formed into the matrix form, whereby a depletion layer in the active region can be increased to a maximum with a minimum of reduction of the area of the active region. Preferably, the semiconductor regions 6 are therefore formed into the matrix form. The semiconductor region 6 is, for example, about 2 μm square in size. The semiconductor region 6 has a depth of about 1.5 μm to 2 μm in the same manner as the guard ring 4. The distance w is such that the adjacent depletion layers of pn junctions between the $n^+$-type semiconductor layer 2 and the adjacent $p^+$-type semiconductor regions 6 are in contact with each other. For example, when a width of the depletion layer is about 1.5 μm, the distance w is set to about 2.5 μm to 3.5 μm.

On the other hand, the thickness (depth) d of the semiconductor layer 2 under the $p^+$-type semiconductor region 6 is set to about 2.5 μm to 4.5 μm because the thickness of about 1 μm to 3 μm must be further secured under the width of the depletion layer (about 1.5 μm) in order to obtain a withstand voltage of tens of volts. That is, the inventor found the following fact. The semiconductor regions 6 are formed so that the ratio of the distance w between the $p^+$-type semiconductor regions 6 to the depth d of the semiconductor layer 2 under the $p^+$-type semiconductor region 6 may be the ratio of 1 to 1 through 2, whereby while the withstand voltage of tens of volts for normal use is kept, a forward voltage can be reduced by reducing a forward resistance. That is, the sufficient withstand voltage cannot be obtained when the depth d of the semiconductor layer 2 is less than this ratio, and the forward voltage cannot be reduced when the depth d is more than this ratio.

The metal layer 3 is used to form the Schottky barrier (Schottky junction) together with the semiconductor layer. An insulating film 5 is previously formed outside a part of the guard ring 4 on the outer periphery of an active region A of the semiconductor layer 2 having the $p^+$-type semiconductor regions 6. The metal layer 3 is formed on the surface of the active region A and the $p^+$-type semiconductor regions 6 to the thickness of about 0.1 μm to 1 μm by sputtering, vacuum evaporation or the like. Although a barrier value varies depending on a material of the metal layer 3 as described above, titanium (Ti), molybdenum (Mo) or the like, for example, is used as the metal layer 3. Overmetal (not shown) such as silver (Ag) or aluminum (Al) is further formed to the thickness of about 1 μm to 5 μm on the surface of the metal layer 3 by sputtering, vacuum evaporation or the like. The overmetal is completely electrically connected to the metal layer 3 and used as an electrode pad. Although not shown, electrodes composed of Ni, Au or the like are formed on a rear surface of the semiconductor substrate 1.

Figure 2:
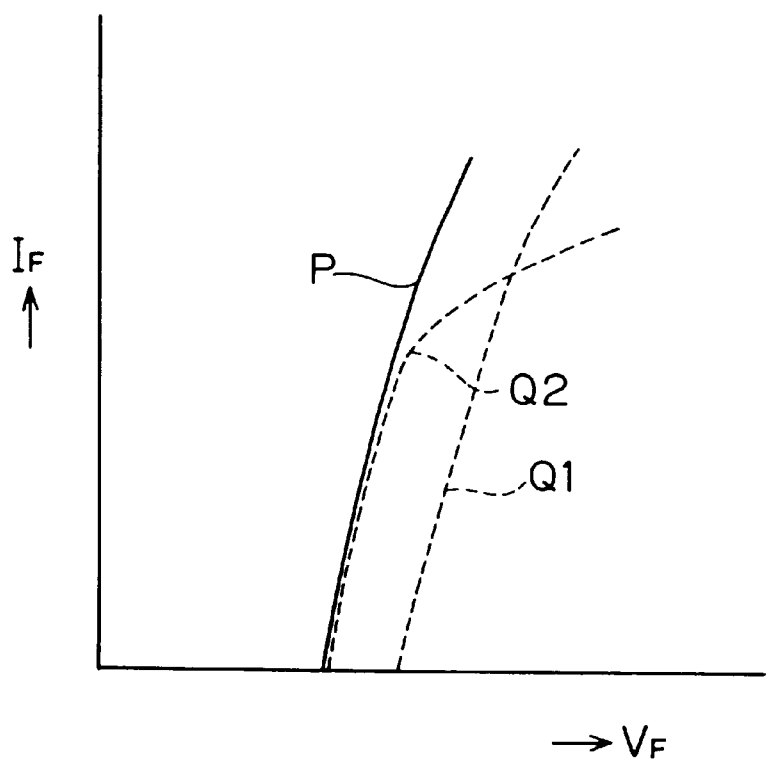
FIG. 2 is a graph showing $V_F$–$I_F$ properties of the Schottky barrier semiconductor device of FIG. 1.
Figure 3:
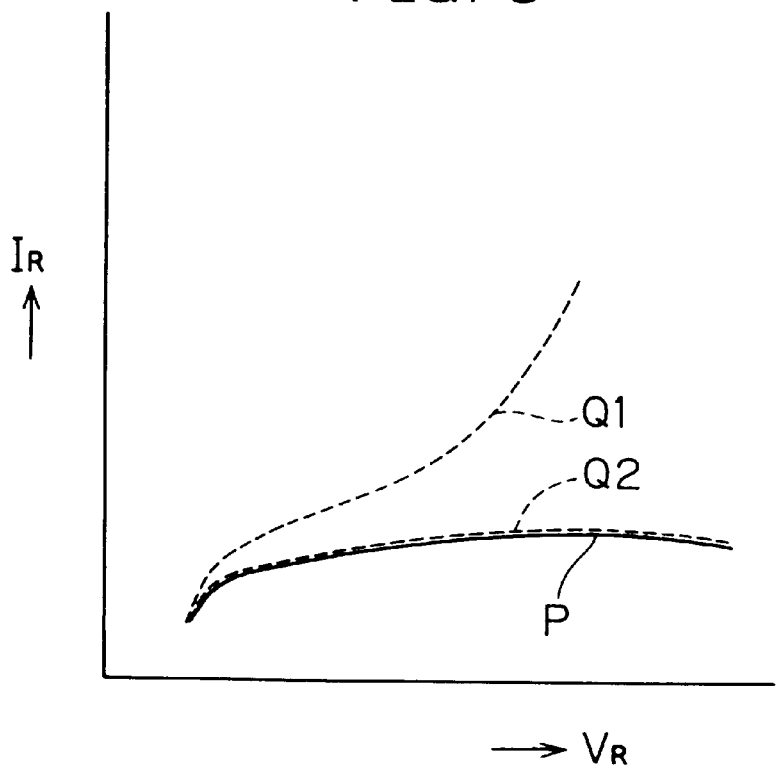
FIG. 3 is a graph showing $V_R$–$I_R$ properties of the Schottky barrier semiconductor device of FIG. 1.
Figure 9:
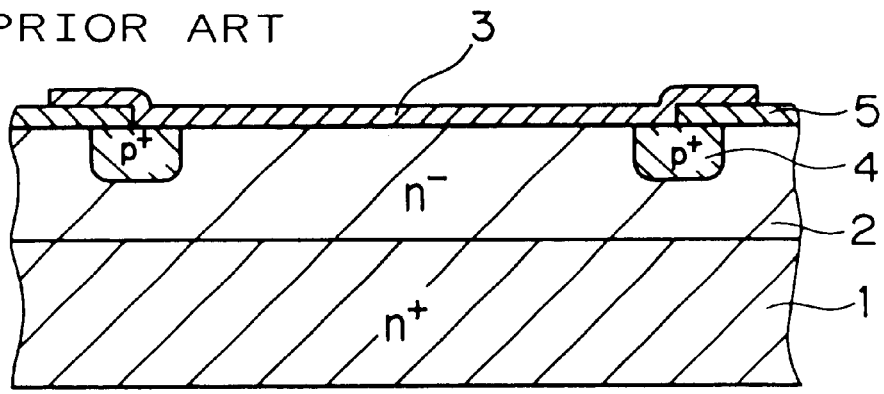
FIG. 9 is a cross sectional view of the Schottky barrier semiconductor device of the prior art.
Figure 10:
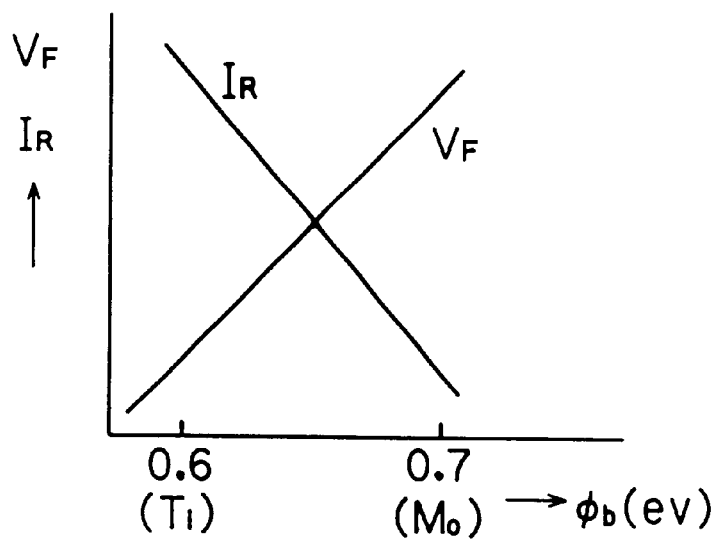
FIG. 10 is a graph of a relationship among a barrier value between a semiconductor layer and a metal layer, a forward voltage $V_F$ and a reverse leakage current $I_R$.
Figure 11:
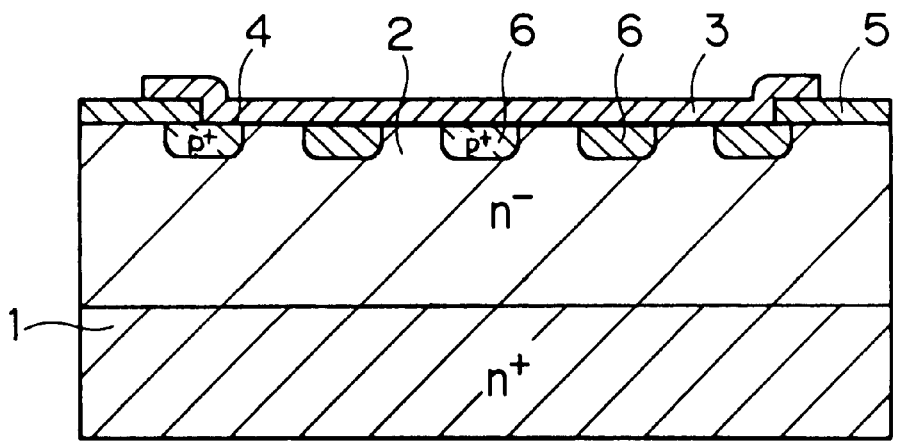
FIG. 11 is a cross sectional view of another structure of the Schottky barrier semiconductor device of the prior art.

FIG. 2 shows a relationship of a forward current $I_F$ to a forward voltage $V_F$ of a Schottky barrier diode having a structure in which w is related to d as shown in FIG. 1. FIG. 3 shows the relationship of a leakage current $I_R$ to a reverse voltage $V_R$ of the Schottky barrier diode. In FIGS. 2 and 3, properties P of the present invention are shown in comparison to properties Q1 and Q2 of the prior-art structures shown in FIGS. 9 and 11 respectively. As can be seen from FIG. 2, the properties Q2 of the prior-art structure shown in FIG. 11 exhibit the fact that the more the current is, the higher the forward voltage is. On the other hand, the properties P of the present invention exhibit the fact that even if the current is increased, the forward voltage is not increased so much. Moreover, there is little difference between the properties P of the present invention of the leakage current to the reverse voltage and the properties Q2 of the prior-art structure shown in FIG. 11. That is, it is seen that the present invention maintains high performance for the leakage current.

According to the present invention, a plurality of adjacent second conductive type semiconductor regions are formed on the surface of the first conductive type semiconductor layer that is an active layer. The distance between the adjacent semiconductor regions is such that the depletion layers are in contact with each other. The thickness d of the first conductive type semiconductor layer under the semiconductor region is 1 to 2 times the distance w between the second conductive type semiconductor regions. Thus, the first conductive type semiconductor layer that is the active region is substantially covered with the depletion layer. Therefore, the leakage current can be prevented and thus a reverse leakage current can be greatly reduced. On the other hand, the first conductive type semiconductor layer is set to the minimum thickness which can keep a reverse withstand voltage of tens of volts under the second conductive type semiconductor region. Consequently, while the reverse withstand voltage is kept, a serial resistance can be reduced and thus the forward voltage is reduced. That is, the increase of the serial resistance, which is caused due to the reduction of the area of the active region owing to the second conductive type semiconductor regions formed on the active layer, is canceled by reducing the thickness. As a result, both of the leakage current and the forward voltage are reduced.

Figure 4:
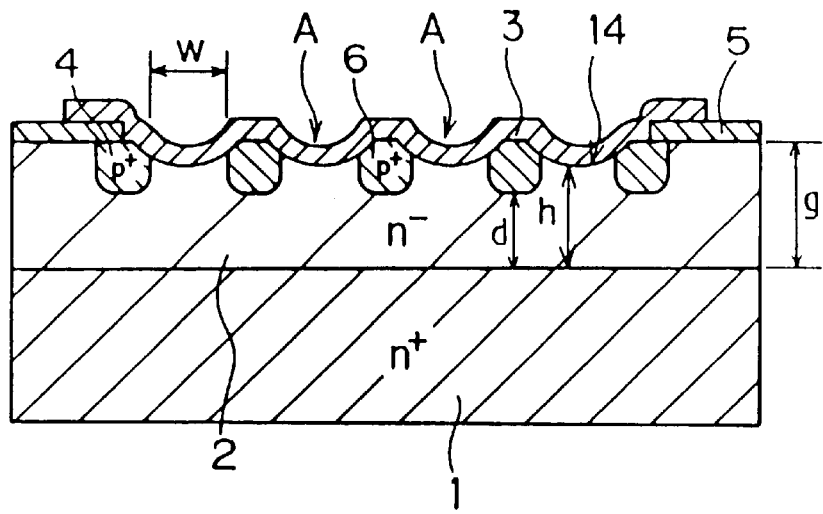
FIG. 4 is a cross sectional view of another embodiment of the Schottky barrier semiconductor device of the present invention.
Figure 5:
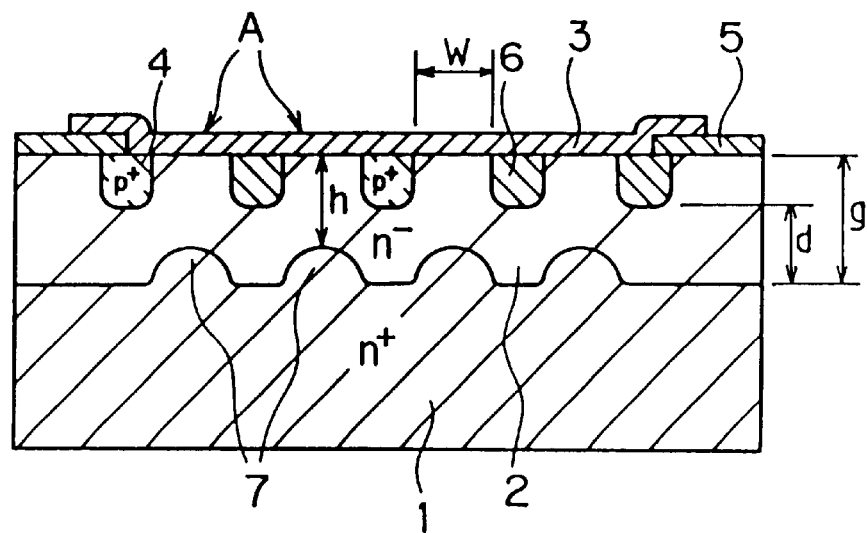
FIG. 5 illustrates still another embodiment of the Schottky barrier semiconductor device of the present invention.
Figure 6:
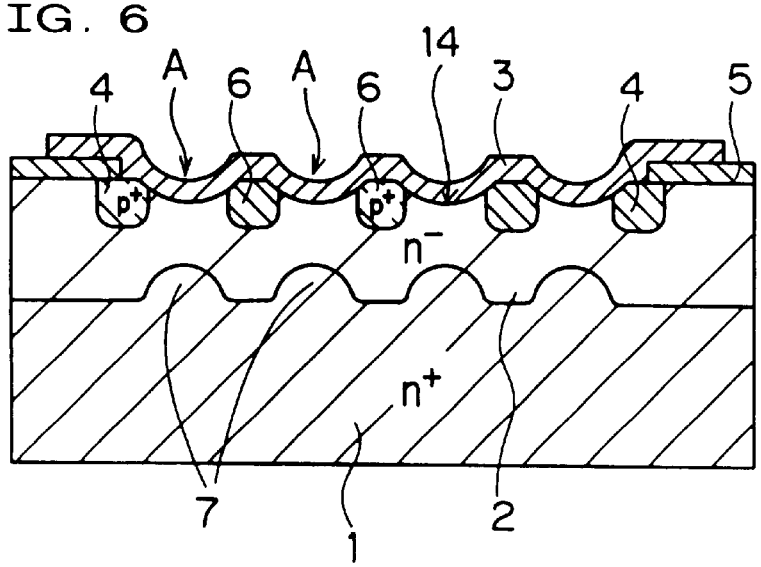
FIG. 6 illustrates a further embodiment of the Schottky barrier semiconductor device of the present invention.

In this manner, the first conductive type semiconductor layer is set to the minimum thickness, whereby the forward voltage is reduced, but a path for the current in the active region is the area having no second conductive type semiconductor region. Therefore, the structures shown in FIGS. 4 to 6 are additionally employed so as to reduce the thickness of the first conductive type semiconductor layer in the area having no second conductive type semiconductor region, whereby the forward voltage can be further reduced. The embodiments shown in FIGS. 4 to 6 are used together with the structure which is formed so that the thickness d of the first conductive type semiconductor layer may be 1 to 2 times the distance w between the second conductive type semiconductor regions, whereby much more excellent effect is obtained. However, even if the thickness of the first conductive type semiconductor layer is not limited, the forward voltage can be reduced.

In the embodiment shown in FIG. 4, the device comprises; heavily-doped and first conductive type, for example the $n^+$-type, semiconductor substrate 1; lightly-doped and first conductive type, for example the $n^-$-type, semiconductor layer 2 grown on the semiconductor substrate 1 by epitaxial growth; two or more adjacent second conductive type, for example $p^+$-type semiconductor regions 6 formed on the surface of the semiconductor layer 2; and the metal layer 3 having the Schottky barrier on the surface of the active region of the semiconductor layer 2. A thickness h of the lightly-doped and first conductive type semiconductor layer 2 that is the active region which does not have the adjacent second conductive type semiconductor regions 6 is less than a distance g between an upper surface of the second conductive type semiconductor region 6 and the upper surface of the semiconductor substrate 1 (the bottom surface of the semiconductor layer 2).

The semiconductor substrate 1, the semiconductor layer 2, the metal layer 3, the guard rings 4 and the second conductive type ($p^+$-type) semiconductor regions 6 are formed in the same manner as the above-mentioned embodiment. Accordingly, the thickness (depth) d of the semiconductor layer 2 under the $p^+$-type semiconductor region 6 is set to such a minimum depth that the withstand voltage of tens of volts is obtained. More particularly, the thickness d is set to about 2.5 $\mu$m to 4.5 $\mu$m so that the thickness of about 1 $\mu$m to 3 $\mu$m may be further secured under the width of the depletion layer (about 1.5 $\mu$m). That is, as described above, preferably, the ratio of the distance w between the $p^+$-type semiconductor regions 6 to the depth d of the semiconductor layer 2 under the $p^+$-type semiconductor region 6 is the ratio of 1 to 1 through 2.

In this embodiment, concavities 14 are formed on the surface of the $n^-$-type semiconductor layer 2 that is the active region A between the $p^+$-type semiconductor regions 6. The distance h between the surface of the concavity 14 and the upper surface of the semiconductor substrate 1 is less than the distance g between the surface of the $p^+$-type semiconductor region 6 and the surface of the semiconductor substrate 1 by about 1 $\mu$m to 1.5 $\mu$m equal to the depth of the concavity 14. The concavity 14 is formed in the following manner. For example, forming an oxidation-resistant mask such as silicon nitride on the surface of the $p^+$-type semiconductor region 6 and oxidizing, whereby only the exposed surface of the $n^-$-type semiconductor layer 2 is oxidized. Then, an oxide film is removed by etching. Or without providing the oxide film, the semiconductor layer may be directly etched by masking. Preferably, the oxide film is formed and then etched because the oxide film is in no danger of being over-etched, the oxide film is easily formed to an accurate thickness and the depth of the concavity 14 is easily controlled.

Next, a method of manufacturing the Schottky barrier semiconductor device shown in FIG. 4 will be described with reference to FIGS. 7(a) to 7(d).

Figure 7A:
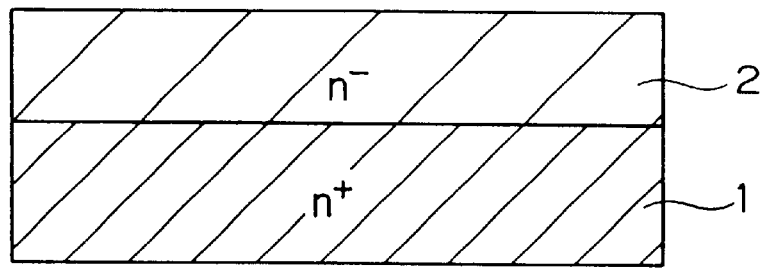
FIGS. 7(a) to 7(d) are cross sectional views showing a process of manufacturing the Schottky barrier semiconductor device of FIG. 4.

First, as shown in FIG. 7(a), the $n^-$-type silicon semiconductor layer 2 having an impurity density of about $1 \times 10^{15}$ cm$^{-3}$, for example is grown by epitaxial growth to the thickness of about 4 $\mu$m to 6.5 $\mu$m on the surface of the $n^+$-type semiconductor substrate 1 having an impurity density of about $1 \times 10^{19}$ cm$^{-3}$, for example.

Figure 7B:
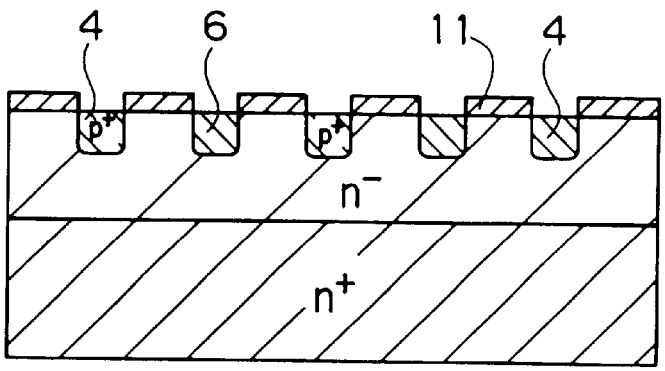

Then, as shown in FIG. 7(b), the insulating film composed of $SiO_2$ or the like is formed on the surface of the semiconductor layer 2 by CVD or the like. A mask 11 is formed by opening the area in which the second conductive type semiconductor regions 6 are to be formed, with etching the insulating film selectively. An impurity such as boron (B) is introduced and diffused into the semiconductor layer 2, whereby the $p^+$-type semiconductor regions 6 are formed so that the depth thereof may be about 1.5 $\mu$m to 2 $\mu$m and the size thereof may be about 2 $\mu$m square.

Figure 7C:
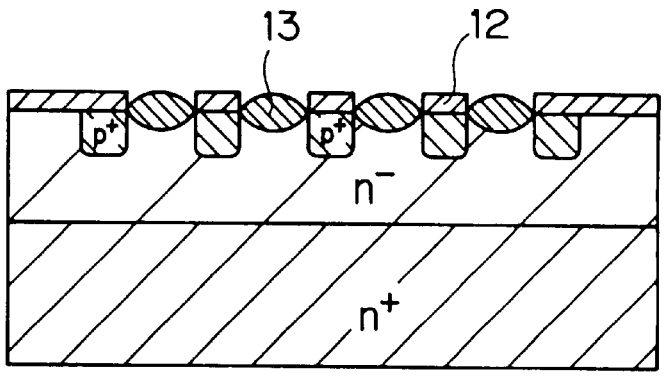

Then, the mask 11 is removed. An oxidation-resistant insulating film such as a silicon nitride film is further formed by CVD or the like in the same manner. The semiconductor layer 2 is patterned by photolithography in such a manner that only the $p^+$-type semiconductor regions 6 are coated with the mask and the $n^-$-type semiconductor layer 2 between the $p^+$-type semiconductor regions 6 is exposed, whereby an oxidation-resistant mask 12 is formed. Then, the semiconductor layer 2 is subjected to heat treatment for about 250–350 minutes at about 1000–1200° C. in an oxidizing atmosphere, whereby an oxide film 13 of about 1 $\mu$m to 1.5 $\mu$m thick is formed as shown in FIG. 7(c).

Figure 7D:
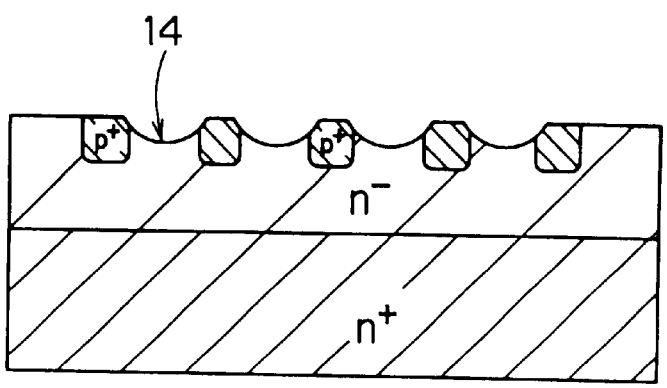

Then, as shown in FIG. 7(d), the oxidation-resistant mask 12 and the oxide film 13 formed by the above-described oxidation are removed by an etchant such as hydrofluoric acid. The concavities 14 are formed on the exposed surface of the $n^-$-type semiconductor layer 2 between the $p^+$-type semiconductor regions 6.

Then, the film of metal, e.g., Ti or Mo, having the Schottky barrier is formed by sputtering to the thickness of about 0.5 $\mu$m to 1 $\mu$m on the surface of the $n^-$-type semiconductor layer 2 exposed by removing the oxide film and the surface of the $p^+$-type semiconductor regions 6. The metal film is patterned in such a manner that the periphery of the guard rings 4 is covered with the metal film, and thus the metal layer 3 is formed, whereby the Schottky barrier diode shown in FIG. 4 is obtained. Then, although not shown, an overcoat film such as Ag or Al is further formed on the surface. Moreover, the electrodes composed of Ni, Au or the like are formed on the rear surface of the semiconductor substrate 1 by sputtering or the like.

According to this embodiment, a plurality of adjacent second conductive type semiconductor regions 6 are formed on the surface of the first conductive type semiconductor layer that is the active layer. Thus, the depletion layer formed between the semiconductor regions 6 can prevent the leakage current to the reverse voltage and therefore the reverse leakage current can be greatly reduced. On the other hand, the surface of the first conductive type semiconductor layer 2 that is the active region A between the second conductive type semiconductor regions 6 is removed by etching or the like, so that the concavities 14 are formed on the surface of the semiconductor layer 2. Thus, the semiconductor layer 2 having a high resistance between the electrodes provided at upper and lower portions of the structure shown in the drawing is thinned, and thus the serial resistance is reduced. Therefore, the second conductive type semiconductor regions 6 are provided, whereby even if the area is reduced and thus the serial resistance is increased, the increment of the serial resistance is canceled and thus the serial resistance can be reduced. As a result, it was obtained the Schottky barrier semiconductor device having the same as the properties shown FIGS. 2 and 3, which can reduce the forward voltage while reducing the leakage current.

According to the above-described manufacturing method, only the oxide film can be selectively etched. Thus, the semiconductor layer is in no danger of being over-etched. Moreover, even if an n-type layer differs from a p-type layer in etching rate, a difference in etching rate does not lead to a difference in depth and therefore the smooth concavities 14 can be formed. Furthermore, the thickness of the oxide film can be precisely controlled in accordance with oxidation time and, as a consequence, the concavities 14 having an accurate depth can be simply formed.

FIG. 5 is a cross sectional view of still another embodiment for further reducing the forward voltage. That is, in the above-described embodiment shown in FIG. 4, the concavities 14 are formed on the surface of the first conductive type semiconductor layer, whereby the thickness of the semiconductor layer in the active region A is thinned and thus the serial resistance is reduced. However, in the embodiment shown in FIG. 5, the concavities 14 are not formed and buried regions 7 are formed. This embodiment is the same as the abovementioned embodiment shown in FIG. 1 in the thickness, the impurity density and so on of the semiconductor substrate 1 and the semiconductor layer 2. This embodiment is the same as the embodiment shown in FIG. 1 also in the structure of the guard rings 4 and the p-type semiconductor regions 6 provided in the semiconductor layer 2 and the metal layer 3.

The buried regions 7 are formed on a lower surface of the semiconductor layer 2 at a gap between the p$^+$-type semiconductor regions 6, i.e., on the side of the semiconductor substrate 1 so that the buried regions 7 have a high impurity density of about $1 \times 10^{16}$ cm$^{-3}$ to $1 \times 10^{18}$ cm$^{-3}$ and a height of about 1 µm to 1.5 µm. As a result, the distance h between the surface of the semiconductor layer 2 in the active region A between the p$^+$-type semiconductor regions 6 and the surface of the heavily-doped buried region 7 is about 1 µm to 1.5 µm less than the distance g between the upper surface of the n$^-$-type semiconductor layer 2 and the upper surface of the semiconductor substrate 1. The buried region 7 is formed in the following manner. For example, before epitaxial growth of the semiconductor layer 2, an n-type impurity is previously introduced into the area for epitaxial growth on the surface of the semiconductor substrate 1 at a dose rate of about $1 \times 10^{16}$ cm$^{-2}$ to $1 \times 10^{20}$ cm$^{-2}$ by ion implantation or the like. The semiconductor layer 2 is grown by epitaxial growth, whereby during epitaxial growth, the impurity is diffused into the epitaxial growth layer and thus the heavilydoped buried layer 7 is formed.

Figure 8:
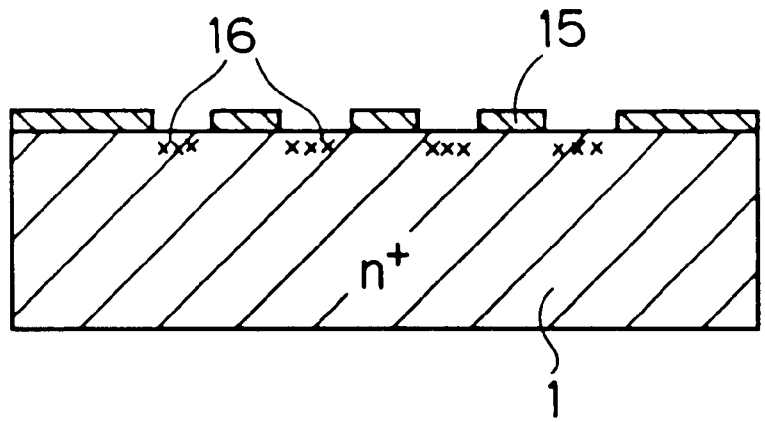
FIGS. 8(a) to 8(c) are cross sectional views showing the process of manufacturing the Schottky barrier semiconductor device of FIG. 5.
Figure 8:
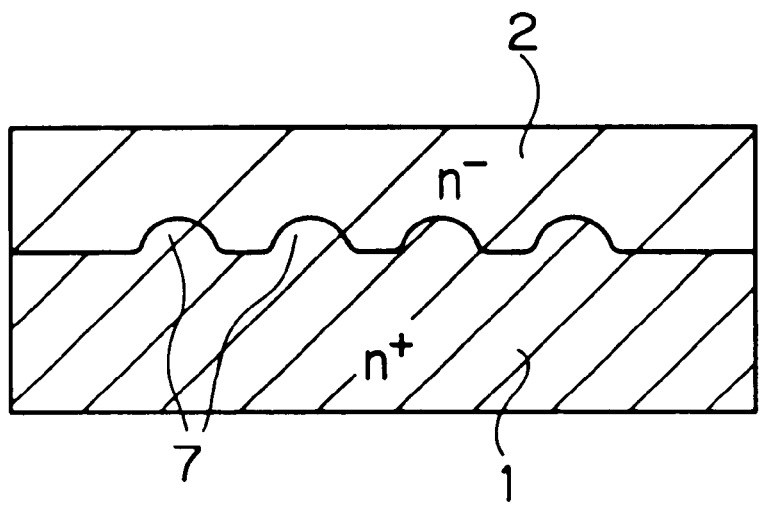
Figure 8:
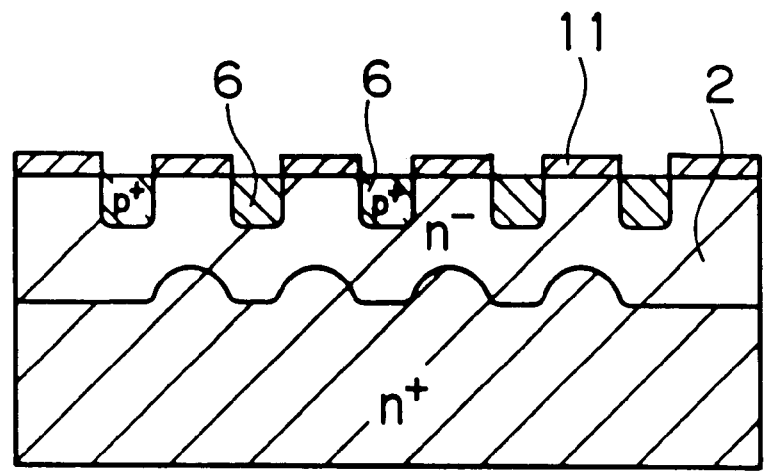

To manufacture the Schottky barrier semiconductor device having this structure, first, as shown in FIG. 8(a), an SiO$_2$ film, for example is formed by CVD or the like on the surface of the n$^+$-type semiconductor substrate having an impurity density of about $1 \times 10^{19}$ cm$^{-3}$, for example. A mask 15 having the opened area corresponding to the area that is the active region between the p$^+$-type semiconductor regions 6 to be later formed is formed. An n-type impurity 16 such as phosphorus (P) is introduced at a dose rate of about $1 \times 10^{16}$ cm$^{-2}$ to $1 \times 10^{20}$ cm$^{-2}$ by ion implantation or the like.

Then, as shown in FIG. 8(b), the n$^-$-type silicon semiconductor layer having an impurity density of about $1 \times 10^{15}$ cm$^{-3}$ is grown by epitaxial growth on the surface of the semiconductor substrate 1 to the thickness of about 4 µm to 6.5 µm. This epitaxial growth is performed for about 10–30 minutes at about 1100–1200° C. Thus, during this epitaxial growth, the introduced impurity 16 is diffused into the growing semiconductor layer 2, so that the buried regions 7 having a high impurity density of about $1 \times 10^{16}$ cm$^{-3}$ to $1 \times 10^{18}$ cm$^{-3}$ are formed.

Next, as shown in FIG. 8(c), the insulating film composed of SiO$_2$ or the like is formed on the surface of the semiconductor layer 2 by CVD or the like. The mask 11 opening the area in which the second conductive type semiconductor regions 6 are to be formed is formed. The impurity such as boron (B) is introduced and diffused into the semiconductor layer 2, whereby the p$^+$-type semiconductor regions 6 are formed so that the depth thereof may be about 1.5 µm to 2 µm and the size thereof may be about 2 µm square.

Then, the mask 11 is removed. The film of the metal, e.g., Ti or Mo, having the Schottky barrier is formed by sputtering to the thickness of about 0.5 µm to 1 µm on the surface of the exposed n$^-$-type semiconductor layer 2 and the p$^+$-type semiconductor regions 6. The metal film is patterned in such a manner that the periphery of the guard rings 4 is covered with the metal film, and thus the metal layer 3 is formed, whereby the Schottky barrier diode shown in FIG. 5 is obtained. Then, although not shown, the overcoat film such as Ag or Al is further formed on the surface. Moreover, the electrodes composed of Ni, Au or the like are formed on the rear surface of the semiconductor substrate 1 by sputtering or the like.

Also in this embodiment, it is possible to obtain the Schottky barrier semiconductor device having the properties which are the same as the properties shown in FIGS. 2 and 3 and much more excellent than the properties of the conventional structure.

Also according to this structure, a plurality of adjacent second conductive type semiconductor regions 6 are formed on the surface of the first conductive type semiconductor layer that is the active layer. Thus, the depletion layer formed between the semiconductor regions 6 can prevent the leakage current to the reverse voltage and therefore the reverse leakage current can be greatly reduced. On the other hand, the heavily-doped buried regions 7 are formed on the bottom surface of the first conductive type semiconductor layer 2 that is the active region A between the second conductive type semiconductor regions 6. Thus, the semiconductor layer 2 having a high resistance between the electrodes provided at the upper and lower portions of the structure shown in the drawing is thinned, and thus the serial resistance is reduced. Therefore, the second conductive type semiconductor regions 6 are provided, whereby even if the area is reduced and thus the serial resistance is increased, the increment of the serial resistance is canceled and thus the serial resistance can be reduced. As a result, it is possible to obtain the Schottky barrier semiconductor device which can reduce the forward voltage while reducing the leakage current.

Moreover, according to the manufacturing method shown in FIGS. 8(a) to 8(c), without an additional process such as particular etching, the semiconductor layer of a high resistance in the active region can be simply thinned and thus the serial resistance can be reduced.

The embodiment shown in FIG. 6 includes both the structures of FIGS. 4 and 5. The concavities 14 are formed on the surface of the active region and the n⁺-type and heavily-doped buried regions 7 are formed in the semiconductor layer 2 in the active region A on the side of the semiconductor substrate 1, whereby the n⁻-type semiconductor layer 2 is further reduced in the active region A alone. That is, the active region A does not have the p⁺-type semiconductor region 6. Thus, even if the heavily-doped buried regions 7 are formed, there is no cause by which the reverse withstand voltage is reduced. Therefore, prior to epitaxial growth of the semiconductor layer 2, the n-type impurity is previously introduced into the area for epitaxial growth on the semiconductor substrate 1. The impurity is diffused during epitaxial growth of the semiconductor layer 2, whereby the heavily-doped buried regions 7 of about 1 μm to 2 μm in height can be formed. Consequently, it is possible to obtain the Schottky barrier semiconductor device having the much lower forward voltage and much less leakage current than the embodiments of FIGS. 4 and 5.

According to the present invention, a plurality of adjacent second conductive type semiconductor regions are formed on the first conductive type semiconductor layer that is the active layer. Thus, the width of the depletion layer can prevent the leakage current. Moreover, the increase of the resistance due to the reduction of the area of the active region owing to the second conductive type semiconductor regions is canceled by setting the first conductive type semiconductor layer to the minimum thickness or by reducing the thickness of the first conductive type semiconductor layer in the active region. Thus, the serial resistance can be reduced and therefore the forward voltage can be reduced. As a result, it is possible to obtain the highperformance Schottky barrier semiconductor device having the low forward voltage and less leakage current. Therefore, this device contributes greatly to the thinning and reduction and the power saving of electronic equipment.

Although preferred example have been described in some detail, it is to be understood that certain changes can be made by those skilled in the art without departing from the spirit and scope of the invention as defined by the appended claims.

What is claimed is:

1. A Schottky barrier semiconductor device comprising:
   a heavily-doped and first conductive type semiconductor substrate;
   a lightly-doped and first conductive type semiconductor layer grown by epitaxial growth on said semiconductor substrate;
   two or more adjacent second conductive type semiconductor regions formed on a surface of said semiconductor layer; and
   a metal layer having a Schottky barrier formed on the surface of said semiconductor layer and said second conductive type semiconductor regions,
      wherein said second conductive type semiconductor regions are formed so that a ratio of a distance between said adjacent second conductive type semiconductor regions to a distance between a bottom surface of said second conductive type semiconductor region and a bottom surface of said first conductive type semiconductor layer is the ratio of 1 to 1 through 2.

2. The device according to claim 1, wherein the distance between said adjacent second conductive type semiconductor regions is such that depletion layers formed in said first conductive type semiconductor layer by said adjacent second conductive type semiconductor regions for a desired reverse withstand voltage are in contact with each other.

3. The device according to claim 1, wherein a thickness of said lightly-doped and first conductive type semiconductor layer that is an active region which does not have said second conductive type semiconductor regions is less than a distance between an upper surface of said second conductive type semiconductor region and an upper surface of said semiconductor substrate.

4. The device according to claim 1, wherein said second conductive type semiconductor regions are formed into a matrix form.

5. A Schottky barrier semiconductor device comprising:
   a heavily-doped and first conductive type semiconductor substrate;
   a lightly-doped and first conductive type semiconductor layer grown by epitaxial growth on said semiconductor substrate;
   two or more adjacent second conductive type semiconductor regions formed on a surface of said semiconductor layer; and
   a metal layer having a Schottky barrier formed on the surface of said semiconductor layer and said second conductive type semiconductor regions,
      wherein a thickness of said lightly-doped and first conductive type semiconductor layer that is an active region which does not have said second conductive type semiconductor regions is less than a distance between an upper surface of said second conductive type semiconductor region and an upper surface of said semiconductor substrate.

6. The device according to claim 5, wherein the distance between said adjacent second conductive type semiconductor regions is such that the depletion layers formed in said first conductive type semiconductor layer by said adjacent second conductive type semiconductor regions for a desired reverse withstand voltage are in contact with each other.

7. The device according to claim 5, wherein said second conductive type semiconductor regions are formed into a matrix form.

8. The device according to claim 5, wherein a part of the surface of said first conductive type semiconductor layer that is the active region which does not have said second conductive type semiconductor regions is removed, whereby said first conductive type semiconductor layer is thinned.

9. The device according to claim 8, wherein first conductive type and heavily-doped buried regions are formed on the side of said semiconductor substrate in said first conductive type semiconductor layer that is the active region which does not have said second conductive type semiconductor regions, whereby said lightly-doped semiconductor layer is thinned.

10. The device according to claim 8, wherein said second conductive type semiconductor regions are formed so that a ratio of a distance between said adjacent second conductive type semiconductor regions to a distance between a bottom surface of said second conductive type semiconductor region and a bottom surface of said first conductive type semiconductor layer may be the ratio of 1 to 1 through 2.

11. The device according to claim 5, wherein first conductive type and heavily-doped buried regions are formed on the side of said semiconductor substrate in said first conductive type semiconductor layer that is the active region which does not have said second conductive type semiconductor regions.

12. The device according to claim 11, wherein said second conductive type semiconductor regions are formed so that the ratio of the distance between said adjacent second conductive type semiconductor regions to the distance between the bottom surface of said second conductive type semiconductor region and the bottom surface of said first conductive type semiconductor layer may be the ratio of 1 to 1 through 2.

* * * * *

UNITED STATES PATENT AND TRADEMARK OFFICE
CERTIFICATE OF CORRECTION

PATENT NO. : 6,307,244 B1
DATED : October 23, 2001
INVENTOR(S) : Hideaki Shikata Page 1 of 1

It is certified that error appears in the above-identified patent and that said Letters Patent is hereby corrected as shown below:

Title page,
Please change the title to -- SCHOTTKY BARRIER SEMICONDUCTOR DEVICE AND METHOD OF MANUFACTURING THE SAME --
Please delete "SCHOTTKY BARRIER SEMICONDUCTOR DEVICE"

Signed and Sealed this

Thirtieth Day of April, 2002

*Attest:*

JAMES E. ROGAN
*Attesting Officer*   *Director of the United States Patent and Trademark Office*